(12) United States Patent
Takiba

(10) Patent No.: US 9,065,388 B2
(45) Date of Patent: Jun. 23, 2015

(54) OPTICAL RECEIVING CIRCUIT

(75) Inventor: Yukiko Takiba, Kanagawa-ken (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 1048 days.

(21) Appl. No.: 13/106,233

(22) Filed: May 12, 2011

(65) Prior Publication Data

US 2011/0278437 A1 Nov. 17, 2011

(30) Foreign Application Priority Data

May 14, 2010 (JP) ................................. 2010-112455

(51) Int. Cl.
*H03F 3/08* (2006.01)
*H03F 3/45* (2006.01)
*H04B 10/69* (2013.01)

(52) U.S. Cl.
CPC .............. *H03F 3/08* (2013.01); *H03F 3/45744* (2013.01); *H04B 10/697* (2013.01); *H03F 3/45* (2013.01)

(58) Field of Classification Search
CPC ............... G01J 1/44; G01J 1/46; H03F 3/087; H03F 3/08; H04B 10/60
USPC ................................ 250/214 A; 398/100, 202
See application file for complete search history.

(56) References Cited

U.S. PATENT DOCUMENTS

| | | | | |
|---|---|---|---|---|
| 5,307,196 A | * | 4/1994 | Kinoshita | 398/202 |
| 5,430,765 A | * | 7/1995 | Nagahori | 375/318 |
| 5,777,507 A | * | 7/1998 | Kaminishi et al. | 327/514 |

(Continued)

FOREIGN PATENT DOCUMENTS

JP P3357772 12/1996

OTHER PUBLICATIONS

Notice of Reasons of Refusal received in corresponding JP Application No. 2010-112455 dated Nov. 8, 2013, along with an English translation thereof.

*Primary Examiner* — Georgia Y Epps
*Assistant Examiner* — Kevin Wyatt
(74) *Attorney, Agent, or Firm* — White & Case LLP

(57) ABSTRACT

Provided is an optical receiving circuit that reduces a distortion of an output pulse width with respect to an input signal by adjusting the division ratio for a voltage applied to resistors in a resistor network. The optical receiving circuit includes: a differential amplifier 2 that converts a current signal converted from an optical input L and outputs a non-inverting voltage V+ and an inverting voltage V− whose amplitudes are regulated; a peak detector 5 that detects a peak voltage Vp of the non-inverting voltage V+ and outputs the peak voltage Vp; a resistor network 4 performing a summation operation based on the peak voltage Vp, the non-inverting voltage V+, and the inverting voltage V− to thereby generate a non-inverting input voltage V1+ and an inverting input voltage V1− whose oscillations cross each other at the middle points of the amplitudes thereof; a discriminator 3 that discriminates a potential at which the oscillations of the non-inverting input voltage V1+ and the inverting input voltage V1− cross each other, and generates a rectangular signal in accordance with the cross potential; and an adjustment circuit 6 that, when the non-inverting voltage V+ or the inverting voltage V− is outputted with the amplitude thereof regulated in the differential circuit, adjusts a relative ratio between the voltages connected respectively to resistors of the resistor network 4, in such a way that the rectangular signal is outputted in the same waveform as the optical input L.

5 Claims, 6 Drawing Sheets

(56) References Cited

U.S. PATENT DOCUMENTS

| | | | |
|---|---|---|---|
| 6,595,708 B1 * | 7/2003 | Yamashita | 398/202 |
| 6,760,552 B1 * | 7/2004 | Tajima et al. | 398/210 |
| 2002/0063937 A1 * | 5/2002 | Kikuchi | 359/189 |
| 2007/0098416 A1 * | 5/2007 | Nogami et al. | 398/208 |
| 2008/0002993 A1 * | 1/2008 | Kirkpatrick et al. | 398/202 |
| 2010/0019132 A1 * | 1/2010 | Uo | 250/214 R |

* cited by examiner

OPTICAL RECEIVING CIRCUIT

CROSS REFERENCE TO RELATED APPLICATION

This application is based upon and claims the benefit of priority from prior Japanese Patent Application No. 2010-112455, filed on May 14, 2010, the entire contents of which are incorporated herein by reference.

FIELD

Exemplary embodiment described herein generally relate to an optical receiving circuit of an optical data transmission device.

BACKGROUND

In recent years, there have been increasing demands for a larger capacity and a higher rate in information and communication equipment along with development of multimedia. Signals transmitted through interconnection in information equipment or the like are digital signals of required patterns containing burst signals. It is necessary that optical interconnection transmit such signals correctly, as a matter of course. In addition, challenges to be tackled for optical interconnection used in place of electrical interconnection are downsizing the circuit configuration and lowering the power consumption and cost.

FIG. 6 discloses an optical receiving circuit achieving a fine data transmission efficiency with a relatively simple circuit configuration. As shown in FIG. 6, this optical receiving circuit includes: an optical semiconductor detector (hereinafter, referred to as PD (photodiode)) 1 that converts an optical input L into a current signal; a differential amplifier 2 that converts the current to voltages, and outputs a non-inverting voltage V+ and an inverting voltage V−; a peak detector 5 that detects and outputs a peak voltage Vp of a signal of the non-inverting voltage V+ of the differential amplifier 2; a resistor network 4 that generates a non-inverting input voltage V1+ and an inverting input voltage V1− oscillating at an equal amplitude and being 180° out-of-phase with each other, on the basis of the peak voltage Vp, the non-inverting voltage V+, and the inverting voltage V−; and a discriminator 3 that discriminates signals of the non-inverting input voltage V1+ and the inverting input voltage V1− and outputs a rectangular waveform.

Resistors R1, R2, R3, and R4 constituting the resistor network 4 have such a certain relationship that a non-inverting input voltage V1+ and an inverting input voltage V1− whose oscillations cross each other at the middle points of the amplitudes thereof can be generated at respective nodes (a) and (b) in the resistor network 4.

In general, the output of the differential amplifier 2 has such characteristics that the output amplitude thereof varies in accordance with the input. In order to handle a wide range of input, it is common to employ a configuration additionally including a clamping circuit 2a so as to regulate an amplitude voltage in a case of an input equal to or greater than a given level.

However, regulating the amplitude voltage of the differential amplifier 2 by means of the clamping circuit 2a affects, specifically, widens the pulse widths of the non-inverting voltage V+ and the inverting voltage V−. As a result, an output voltage Vo is outputted with its pulse width distorted with respect to the optical input L. This leads to a problem of causing transmission errors.

Accordingly, there is a demand to reduce a distortion of the pulse width of the output voltage Vo with respect to the optical input L, in a case where the pulse widths of output signals of the differential amplifier are widened as a result of regulating the amplitude voltage of the differential amplifier.

DETAILED DESCRIPTION

According to one embodiment, An optical receiving circuit comprising: an optical semiconductor detector receiving an optical input signal and converting the optical input signal into a current signal; a differential amplifier capable of receiving the converted current signal, and outputting a non-inverting voltage signal and an inverting voltage signal, whose amplitudes are regulated within a predetermined range, from a non-inverting voltage terminal and an inverting voltage terminal of the differential amplifier, respectively; a peak detector detecting a peak voltage of the non-inverting voltage signal and outputting the peak voltage from a peak voltage terminal thereof; a resistor network performing a summation operation based on the peak voltage, the non-inverting voltage signal, and the inverting voltage signal to thereby generate a second non-inverting voltage signal and a second inverting voltage signal whose oscillations cross each other at middle points of amplitude thereof; a discriminator discriminating a cross potential at which the oscillation of the second non-inverting voltage signal inputted to a second non-inverting voltage terminal crosses the oscillation of the second inverting voltage signal inputted to a second inverting voltage terminal, and generating a rectangular signal in accordance with the cross potential; and an adjustment circuit which, when the non-inverting voltage signal or the inverting voltage signal is outputted with the amplitude thereof regulated in the differential circuit, adjusts a relative ratio between the voltages connected respectively to resistors of the resistor network, in such a way that the rectangular signal is outputted in the same waveform as the optical input.

An embodiment will be described below in detail with reference to the attached drawings mentioned above.

(First Embodiment)

Figure 1:
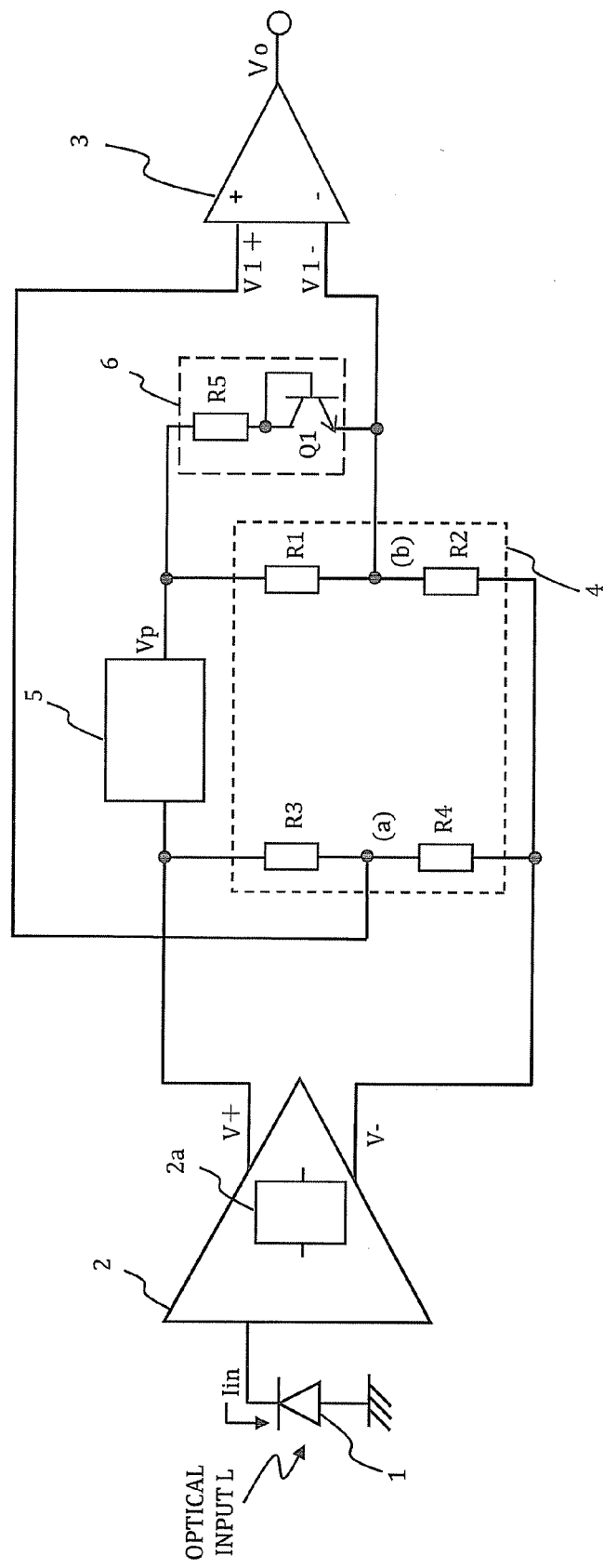
FIG. 1 is a circuit diagram of an optical receiving circuit according to a first embodiment of the present invention.

FIG. 1 is a circuit diagram of an optical receiving circuit according to a first embodiment. As shown in FIG. 1, an optical receiving circuit of a first embodiment includes: an optical semiconductor detector (hereinafter, referred to as photodiode (PD)) 1 that converts an incident optical input L into a current signal; a differential amplifier 2 that outputs different voltages of a non-inverting voltage V+ and an inverting voltage V− on the basis of the input current inputted to the differential amplifier 2; a peak detector 5 that detects a peak voltage Vp of the non-inverting voltage V+; a resistor network 4 that generates two signals having the equal amplitude and crossing each other at the middle points of their amplitudes, on the basis of the output of the peak detector 5, the non-inverting voltage V+, and the inverting voltage V−; and a discriminator 3 that discriminates a cross potential at which the two voltage signals of a non-inverting input voltage V1+ and an inverting input voltage V1− cross each other, to thereby generate an output signal Vo.

The differential amplifier 2 outputs the non-inverting voltage V+ and the inverting voltage V− from its non-inverting terminal and inverting terminal, respectively. The amplitude voltage of each of the non-inverting voltage V+ and the inverting voltage V− is regulated within a predetermined range that is set in advance by a clamping circuit 2a. Thus, even when the optical input L is so large that the amplitude voltage of the differential amplifier 2 exceeds the predetermined range, the maximum preset amplitude voltage is outputted. In the following, a case where the amplitude voltage exceeds the predetermined range will be referred to as "a case where the amplitude voltage is regulated by the clamping circuit 2a," and a case where the amplitude voltage falls within the predetermined range will be referred to as "a case where the amplitude voltage is not regulated by the clamping circuit 2a."

The resistor network 4 is constituted of four resistors R1, R2, R3, and R4 and provides a potential at a node (b) and a potential at a node (a) to an inverting input terminal and a non-inverting input terminal of the discriminator 3, respectively. The node (b) is situated between the resistor R1 connected to the output terminal of the peak detector 5 and the resistor R2 connected to the inverting voltage V−. The node (a) is situated between the resistor R3 connected to the non-inverting voltage V+ and the resistor R4 connected to the inverting voltage V−. As described above, in order to generate two signals having the equal amplitude and crossing each other at the middle points of their amplitudes, on the basis of the peak voltage Vp, the non-inverting voltage V+, and the inverting voltage V−, it is necessary to establish a certain relationship among the four resistors R1, R2, R3, and R4. In this embodiment, as will be described later, resistance values are selected to have a relationship of R1:R2:R3:R4=2:2:1:3.

In the optical receiving circuit with the above-described configuration, upon incidence of an optical input L sent from a sender (not illustrated), the PD 1 converts this optical input L into a current Iin and outputs the current Iin.

The differential amplifier 2 receives the current output Iin and outputs different voltages of a non-inverting voltage V+ and an inverting voltage V− whose amplitudes are similar to each other. When the current from the PD 1 is zero or approximately zero, the non-inverting voltage V+ and the inverting voltage V− have a substantially equal potential. On the other hand, when the current from the PD 1 is at some substantial level or above, the differential amplifier 2 outputs a positive pulse having a predetermined amplitude as the non-inverting voltage V+, as well as a negative pulse having a similar amplitude as the inverting voltage V−.

The non-inverting voltage V+, which is one of the outputs of the differential amplifier 2, is inputted to the peak detector 5, where a peak voltage vp is detected. When the current output Iin is approximately zero, the output voltage Vp from the peak detector 5 is a low voltage similar to the non-inverting voltage V+ and the inverting voltage V−.

On the other hand, when the current output Iin is equal to or above a certain value, the peak voltage Vp of the peak detector 5 rises with a delay corresponding to a response time required inside the peak detector 5. The peak voltage Vp becomes equal to the peak voltage of the pulse ideally within the smallest pulse width of the transmission data. For the decay time of the peak voltage, a decay time constant not smaller than 5 times but not larger than 1000 times as large as the smallest pulse width may be selected.

The non-inverting voltage V+ and the inverting voltage V− of the differential amplifier 2, and the peak voltage Vp of the peak detector 5 are applied to the resistor network 4. The resistor network 4 performs a summation operation based on these three voltages V+, V−, and Vp to generate two signals having the equal amplitude and crossing each other at the middle points of their amplitudes, and supplies the two signals to the discriminator 3.

To be more specific, the resistors R1, R2, R3, and R4 are connected respectively to the peak voltage Vp, the inverting voltage V−, the non-inverting voltage V+, and the inverting voltage V−, and the summation operation of these voltages is performed. It is necessary to establish a certain relationship among the four resistors R1, R2, R3, and R4. As described above, resistance values are selected to have a relationship of R1:R2:R3:R4=2:2:1:3, for example.

In this embodiment, an adjustment circuit 6 to adjust the resistance ratio in the resistor network 4 is connected in parallel to the resistor R1 or R2 of the resistor network 4. As illustrated in FIG. 1, the adjustment circuit 6 may be a circuit equipped with a resistor R5 and a transistor Q1 and having a clamping function. The transistor Q1 in this embodiment is an NPN transistor whose collector electrode and base electrode are connected to each other and whose emitter electrode is connected to a node (b) between the resistors R1 and R2.

Now, an operation of the adjustment circuit 6 will be described. First, in a case where the optical input L is small and thus the amplitude voltage is not regulated by the clamping circuit 2a, i.e., the peak voltage Vp is low, the transistor Q1 of the adjustment circuit 6 is in an OFF state. Thereby, no current flows through the adjustment circuit 6. As a result, a voltage $\{(Vp)+(V-)\}/2$ is generated at the node (b) between the resistors R1 and R2, and a voltage $\{3(V+)+(V-)\}/4$ is generated at the node (a) between the resistors R3 and R4.

In contrast, in a case where the optical input L is large and thus the amplitude voltage is regulated by the clamping circuit 2a, i.e., the peak voltage Vp is a value fixed regardless of the size of the input, the transistor Q1 is turned on. Since the adjustment circuit 6 is connected to the resistor R1 in parallel, the voltage division ratio of the resistors R1 and R2 is changed from 2:2 to a ratio in which the proportion of the resistor R2 is larger. In this way, even when the amplitude regulation affects the output of the differential amplifier 2 and thus widens the pulse widths and distorting the waveforms, the adjustment circuit 6 is operated to adjust the voltage division ratio of the resistors R1 and R2 from 2:2 to a ratio in which the proportion of the resistor R2 is larger.

The discriminator 3 discriminates the cross potential of the two signals obtained as described above and generates an output voltage Vo.

FIGS. 2A to 3D show the waveforms of voltage signals.

Figure 2A:
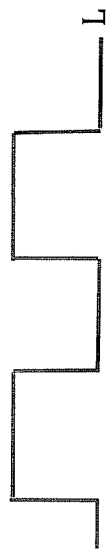
FIGS. 2A to 2D are waveform charts of voltage signals in a main part of an optical receiving circuit which does not receive an effect of an adjustment circuit 6.
Figure 2B:
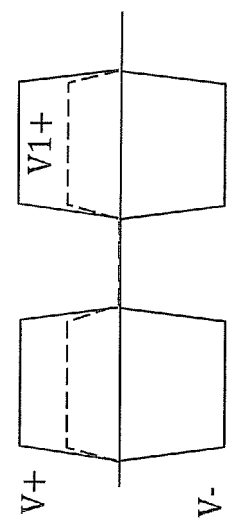
Figure 2C:
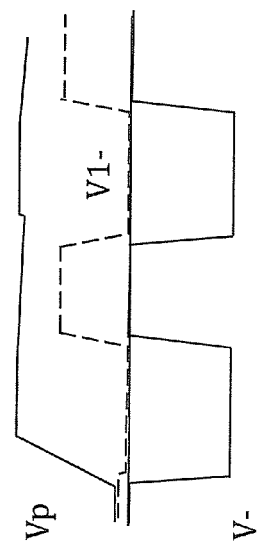
Figure 2D:
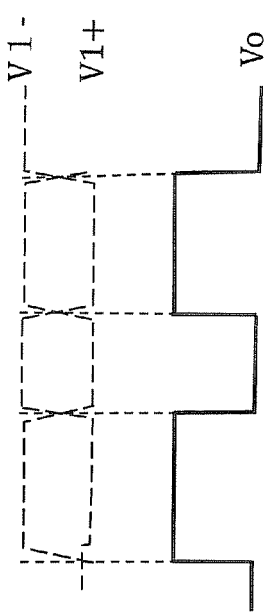

First, the waveforms of voltage signals in a case where the adjustment circuit 6 is not connected to the optical receiving circuit are shown in FIGS. 2A to 2D. FIG. 2A shows the waveform of the optical input L. In FIG. 2B, solid lines indicate the waveforms of the non-inverting voltage V+ and the inverting voltage V− of the differential amplifier 2, respectively, while a dashed line indicates the waveform of the non-inverting input voltage V1+ at the node (b) between the resistors R3 and P4, i.e., the waveform of the voltage signal of the voltage $\{3(V+)+(V-)\}/4$. In FIG. 2C, solid lines indicate the waveforms of the voltage signals of the inverting voltage V− and the peak voltage Vp of the differential amplifier 2, while a dashed line indicates the waveform of the inverting input voltage V1− at the node (c) between the resistors R1 and R2, i.e., the waveform of the voltage {(Vp)+(V−)}/2. In FIG. 2D shows the waveforms of the voltage signals to be discriminated by the discriminator 3, and dashed lines indicate the waveforms of the non-inverting input voltage V1+ and the inverting input voltage V1− while a solid line indicates the waveform of the output voltage Vo of the discriminator 3. The pulse widths of the non-inverting voltage V+ and the inverting voltage V− in FIGS. 2B and 2C are widened due to an influence of the clamping circuit 2a. Hence, the pulse widths of the non-inverting input voltage V1+ and the inverting input voltage V1− are widened similarly. For this reason, as is clear from the waveforms of the two dashed lines shown in FIG. 2D, the non-inverting input voltage V1+ and the inverting input voltage V1− inputted to the discriminator 3 cross each other at the middle points of their amplitudes, but the waveform of the output voltage Vo at this cross potential appears with a distorted pulse width with respect to the optical input L in FIG. 2A.

Figure 3A:
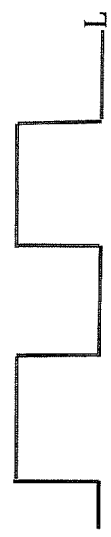
FIGS. 3A to 3D are waveform charts of the voltage signals in the main part of the optical receiving circuit shown in FIG. 1.
Figure 3B:
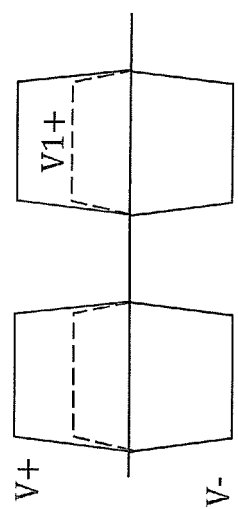
Figure 3C:
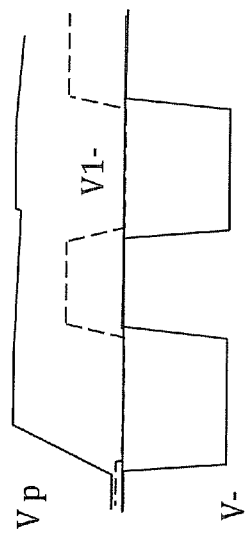
Figure 3D:
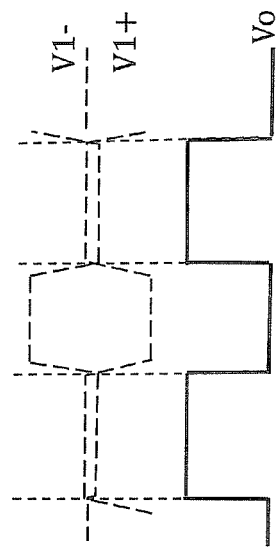

Next, the waveforms of voltage signals receiving an effect of the adjustment circuit 6 are shown in FIGS. 3A to 3D. FIGS. 3A to 3C are the same as FIGS. 2A to 2C, and thus description thereof is omitted. The pulse widths of the non-inverting voltage V+ and the inverting voltage V− in FIGS. 3B and 3C are widened due to the influence of the clamping circuit 2a. Hence, the pulse widths of the non-inverting input voltage V1+ and the inverting input voltage V1− are distorted with respect to the optical input L. In FIG. 3D showing the non-inverting input voltage V1+ and the inverting input voltage V1− with dashed lines, the potential of the inverting input voltage V1− is raised by the adjustment circuit 6. That is, the waveform of the inverting input voltage V1− of the discriminator 3 is shifted up. By this shift up, the potential of the inverting input voltage V1− is adjusted relative to the non-inverting input voltage V1+ in such a way that the output voltage Vo to be generated based on the cross potential of the non-inverting input voltage V1+ and the inverting input voltage V1− can have the same waveform as the optical input L. Accordingly, a distortion of the pulse width of the output voltage Vo of the discriminator 3 with respect to the optical input L can be reduced.

Figure 4:
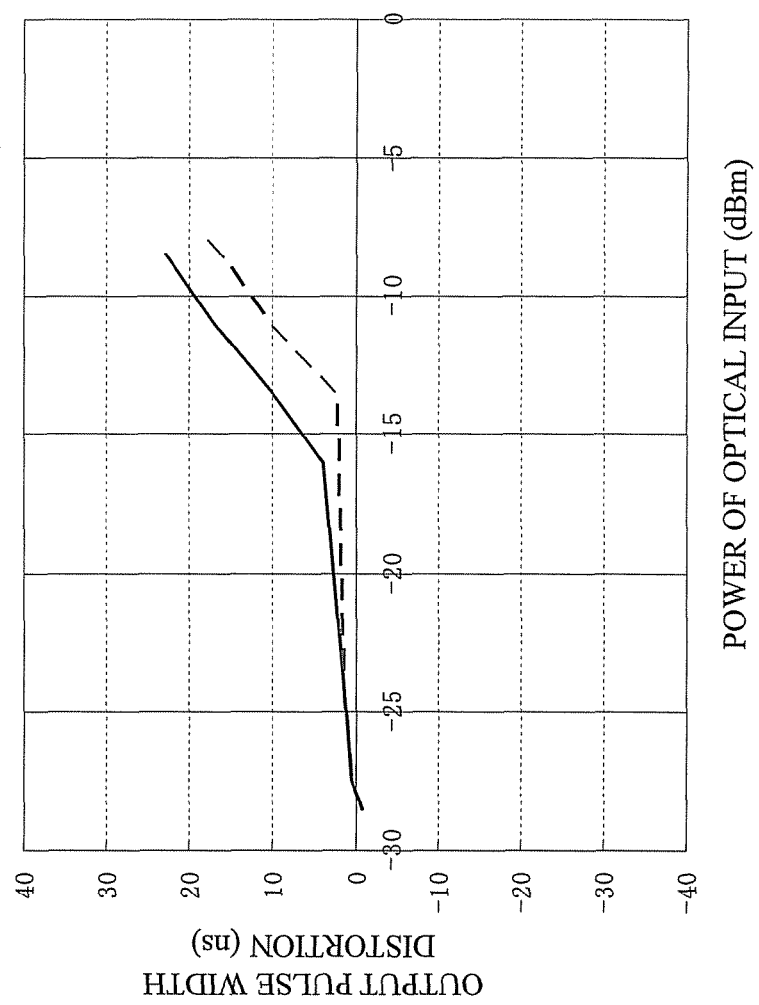
FIG. 4 is a characteristic chart showing an example of characteristics of pulse width distortions with respect to an optical input, which occur in a discriminator.

FIG. 4 shows a result of a simulation regarding the pulse width distortion of the output voltage Vo in the cases of with and without the adjustment circuit 6. In FIG. 4, the horizontal axis represents the power of the optical input while the vertical axis represents the pulse width distortion of the output voltage Vo according to the input signal. The result shows that in a range where the input is large, the pulse width distortion is smaller for the circuit of the present invention equipped with the adjustment circuit 6 (indicated with a dashed line) than the conventional circuit (indicated with a solid line).

As described above, according to this embodiment, even in a case where the current inputted to the differential amplifier 2 is large and thus the amplitude voltage of the output therefrom is regulated, the adjustment circuit 6 automatically adjusts the crossing point of the oscillation of the inverting input voltage V1− or of the non-inverting input voltage V1+ so that the output voltage Vo can have the same waveform as the optical input L. Hence, the waveform of the output voltage Vo of the discriminator 3 is generated with no distortion with respect to the waveform of the optical input L. This allows signal transmission while holding the undistorted pulse width, in a case of the input of logic signal data of any patterns containing a burst signal. Moreover, since coating of the transmission signal and the like are not needed, the data transmission efficiency is high and the delay time is short. With all these considered, the optical receiving circuit of the present invention has an optimum function for optical interconnection.

(Second Embodiment)

Figure 5:
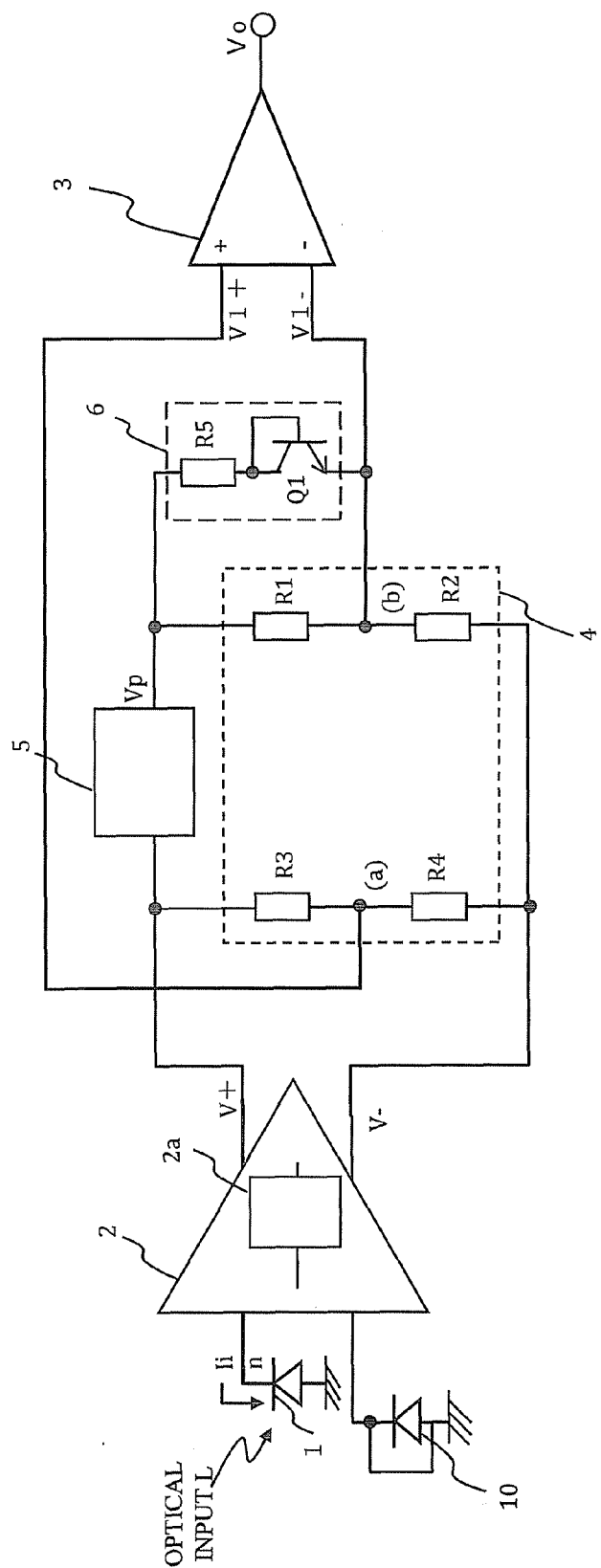
FIG. 5 is an explanatory circuit diagram of an optical receiving circuit according to a second embodiment.
Figure 6:
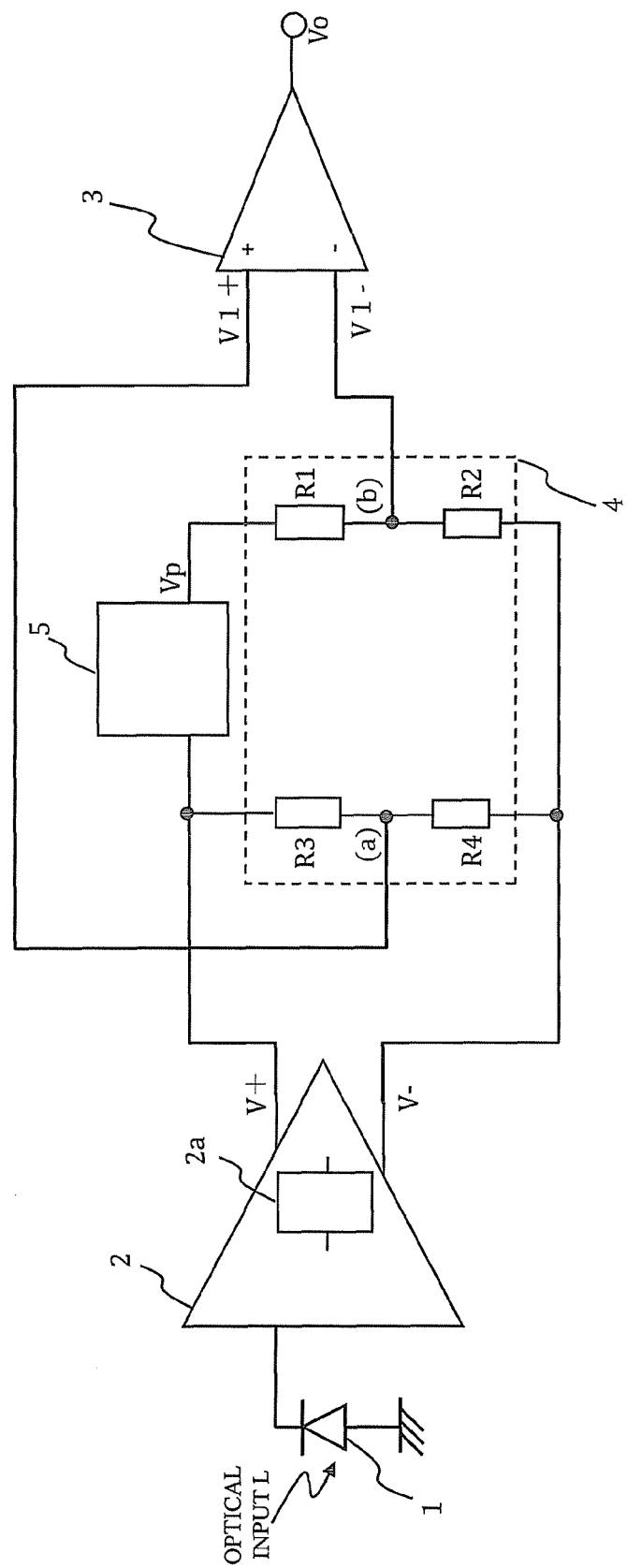
FIG. 6 is a circuit diagram of a conventional optical receiving circuit.

In an embodiment shown in FIG. 5, a dummy photodiode (hereinbelow, referred to as dummy PD) 10 is added to the configuration in FIG. 1 at the inverting input terminal of the differential amplifier 2.

The dummy PD 10 is equivalent to the main PD 1 in terms of pattern and structure but its surface is shielded from light with a wiring layer so as to prevent the incidence of light. Thus, the dummy PD 10 provides no contribution in terms of input signal. However, the junction capacitance of the photodiode is connected equally to the differential input of the differential amplifier 2. Accordingly, there is obtained an effect of reducing a common mode input noise entering the differential circuit 2 from a power supply line through the capacitance of the photodiode. Moreover, an influence of a dark current in the PD 1 is cancelled, enabling an operation in a higher temperature atmosphere.

The above embodiments have been described referring to examples. However, the embodiments are not limited to these examples. That is, changes and modifications of the design adequately performed by those skilled in the art are included in the embodiments as far as those changes and modifications have the characteristics of the embodiments. Furthermore, elements and their arrangement, material, condition, shape, size, and the like given in the above examples are not limited to those described ones, and can be changed and modified adequately without departing from the scope of the embodiments.

What is claimed is:

1. An optical receiving circuit comprising:
   An optical semiconductor detector configured to receive an optical input signal and convert the optical input signal into a current signal;
   a differential amplifier configured to receive the converted current signal, and output a non-inverting voltage signal and an inverting voltage signal, amplitudes of the non-inverting voltage signal and the inverting voltage signal being regulated within a predetermined range;
   a peak detector configured to detect a peak voltage of the non-inverting voltage signal;
   a resistor network configured to generate a second non-inverting voltage signal and a second inverting voltage signal;
   a discriminator configured to discriminate a cross potential at which an oscillation of the second non-inverting voltage signal crosses an oscillation of the second inverting voltage signal, and generate a rectangular signal in accordance with the cross potential; and
   an adjustment circuit connected to the resistor network in parallel, the adjustment circuit configured to adjust a potential of the second non-inverting voltage signal to a potential of the second inverting voltage signal, so that a waveform of the rectangular signal is the same as a waveform of the optical input signal.

2. The optical receiving circuit according to claim 1, wherein
   the resistor network includes four resistors R1, R2, R3, and R4 whose resistance values have a predetermined relationship,
   the resistor R1 and the resistor R2 connect in series, and between the peak detector and an inverting voltage terminal of the differential amplifier, the resistor R3 and the resistor R4 connect in series, and between a non-inverting voltage terminal and the inverting voltage terminal of the differential amplifier, the resistor network outputs a potential at a node of the resistor R1 and the resistor R2 as the second inverting voltage signal, and outputs a potential at a node of the resistor R3 and the resistor R4 as the second non-inverting voltage signal, and the adjustment circuit is connected in parallel to the resistor R1.

3. The optical receiving circuit according to claim 2, wherein the four resistors R1 to R4 of the resistor network are configured to have resistance values satisfying a relationship of $2 \cdot R1 = 2 \cdot R2 = 3 \cdot R3 = R4$, and the adjustment circuit includes a transistor connected in series, so that a voltage at the resistor R1 is smaller than the voltage at the resistor R2, when the differential amplifier outputs the non-inverting voltage signal regulated within a predetermine range.

4. The optical receiving circuit according to claim 1, wherein the adjustment circuit includes a transistor and a resistor.

5. The optical receiving circuit according to claim 1, further comprising a dummy photodiode connected to an inverting voltage terminal at an input side of the differential amplifier and having a surface shielded from light.

\* \* \* \* \*